July 30, 1963 D. A. RADOVSKY ETAL 3,099,608

METHOD OF ELECTROPLATING ON A DIELECTRIC BASE

Filed Dec. 30, 1959

INVENTORS
*David A. Radovsky,*
*Bruno J. Ronkese*

BY *Sughrue, Rothwell, Mion & Zinn*
ATTORNEYS 3,099,608
Patented July 30, 1963

3,099,608

METHOD OF ELECTROPLATING ON A DIELECTRIC BASE

David A. Radovsky, Poughkeepsie, and Bruno J. Ronkese, Marlboro, N.Y., assignors to International Business Machines Corporation, New York, N.Y., a corporation of New York Filed Dec. 30, 1959, Ser. No. 862,998
9 Claims. (Cl. 204—15)

This invention relates to improvements in electroplating on dielectric base materials. More particularly, this invention relates to a novel method for electroplating a conductive metal on a non-conducting base directly over a thin deposited film of "conductivator" type metal such as palladium in colloidal or semi-colloidal form.

The adjective "conductivator" and the verb "conductivate" are coined terms having a special meaning as used hereinafter in the specification and claims of this application. A conductivator, refers to a metal which is an activator and conductor at the same time when used as described herein, i.e. the metal has the combined functions of simultaneously acting as a conductor and catalyst or activator when placed on a dielectric base for subsequent electroplating while actually being a thin film composed of particles of colloidal or semi-colloidal size which film is substantially non-conductive. Metals which are considered conductivator type metals are metals which can be formed in liquid suspensions as colloids or semi-colloids, such as palladium or other metals capable of functioning in the same manner, e.g. copper, gold, silver, platinum, nickel, cobalt, and iron.

This invention is especially useful in the production of printed circuit boards but is not limited hereto. Printed circuit boards refer to solid circuits formed of a conductive material such as foil positioned on opposite sides of a board-like insulating base. Printed circuit boards are enjoying wide usage in the electrical and electronic industries because of the ease of wiring and low cost circuit connections resulting from using such boards. In order that electrical connections may be established from the circuit made by the conductor on one side of the board to the conductor on the other side of the non-conductive board, it is common practice to form holes through the conductive sheets and insulating board and to conductively connect these sheets through these holes. These holes are called "through holes" and the connections may be by mechanical means such as rivets or eyelets or by coating means such as electroplating a conductor on the surface of the through holes, after first treating the non-conductive surface so that it may be electroplated.

By the use of this invention, the entire circuit including the foil surface layers and the through hole connections may be electrodeposited on the nonconducting board. The invention finds special application in electrically connecting the conductors on opposite sides of printed circuit boards by the disclosed electroplating technique. The known methods of plating through holes in printed circuit boards are all directed to solving the problem of electrodepositing a conductor on a nonconductive terminal board base, and this is broadly the problem which is solved by the use of this invention.

Previous efforts directed to printed circuit board through hole plating have involved the use of graphite in an endeavor to form a conductive base coating on the exposed areas of the through holes. The defects of using graphite as a base layer for subsequent electroplating operations may be summarized as lack of control of the graphite application with the resultant poor deposit of the electroplated metal and non-uniform through hole diameters. It has also been proposed to render the non-conductive through holes conductive for subsequent application of an electroplated conductor material by means of painting a conductive metal powder in an organic vehicle on the base. The difficulties attendant to handling agglomerating metal powders and binders generally place limitations on the process. A further prior art process consists of a three or more step method consisting of placing a "seeding" film of metal catalytic to chemical reduction plating on the base, chemically plating a conductive metal over the "seeding" layer, and subsequently building up the conductive metal by electroplating. The three (or more) step chemical deposition method has advantages over the graphite methods; which advantages are essentially better control over the base layer of catalyst metal deposition and a resultant improved electroplating process with more uniform hole diameters. However, in the three-step process utilizing the chemical deposition of a conductor over a metal catalyst, a subsequent building up by electroplating is necessary as the chemically deposited conductive coating is extremely thin, measuring in the millionths of an inch rather than in thousands, even after a reasonable period of time for chemical deposition. Also, the solution from which the conductor is chemically deposited has a relatively short life and therefore it must be peroidically discarded and replaced. The chemical deposition solution also may have a degrading effect upon the wiring materials and resist inks used in printed circuit techniques.

Accordingly, this invention provides a conductive coating on a nonconductive base with the advantages and best features of the prior art techniques described above while having few of the disadvantages thereof. This is obtained by a novel method based on the discovery that electroplating an insulating base with a conductor could be carried out directly over a thin film of a conductivator type metal, such as described above, in colloidal or semi-colloidal form directly deposited on the base from a liquid suspension.

The objects of this invention may be stated as follows: To provide an improved process for plating on an insulating or dielectric base material to build a conductive foil thereon; to provide an improved process for making an entire printed circuit board by electrodepositing a conductor on a nonconductive base; to provide a simple, controlled and effective process for plating through holes in printed circuit boards with a saving in time, labor and materials over the prior known methods; to provide a better quality and more easily controlled electroplated deposit in through holes of printed circuit boards; to consistently control the diameters of the finished electroplated through holes; and to provide an extremely smooth electroplated through hole to aid in capillary lifting of solder to the top of the hole when encasing a component lead.

Other objects of the invention will be pointed out in the following description and claims and illustrated in the accompanying drawing, which discloses, by way of example, the principle of the invention and the best mode which has been contemplated of applying this principle.

Figure 1:
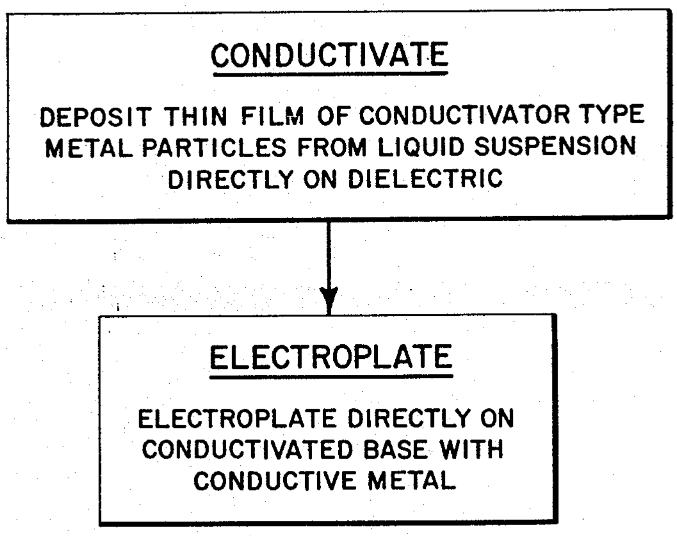
FIGURE 1 illustrates the coating of a nonconductive base by the process of this invention.

In general, this invention contemplates the production of a conductive metal coating on a nonconductive base by depositing a thin film of a conductivator type metal in at least semicolloidal form from a liquid suspension, e.g. colloidal palladium, on a nonconductive base. After the deposition of the extremely thin film of particles of conductivator metal the insulating base board has a high electrical resistance due to the character of the film even though the particles making up the film consist of a conductive metal. The base is then electroplated with a conductor such as copper directly over the film. Other conductive metals may be electrodeposited over the palladium from conventional baths, such as those described in the Electroplating Engineering Handbook, edited by Graham (1955). For example, such baths comprise conventional compositions including copper pyrophosphate, copper fluoborate, copper cyanide, gold cyanide, nickel sulfate, etc. as metal salt. Due to the poor conductivity of the film the plating of a large article must be started at a conventional conductor such as a plating clip. The electroplating then proceeds from the starting conductor and apparently the activating or catalytic action of the conductivator particles in the film accelerate the completion of the electrodeposition.

The process disclosed herein can be utilized for depositing a foil by electroplating on dielectric base materials. One such example is preparing an entire additive printed circuit board by this process of electroplating directly over a deposited film of a conductivator metal in colloidal or semi-colloidal form.

An additive printed circuit board refers to a circuit board made starting from a base devoid of conductive foil and building the conductors constituting the circuit by additive methods. By way of contrast, a subtractive printed circuit board is made starting from an insulating base which has metal foil already placed thereon and portions of the conductive foil are removed by suitable means such as etching or grinding to leave a pattern of the conductor remaining on the base i.e. the unwanted conductive material is subtracted from the starting foil clad base.

An entire additive printed circuit board may be made starting with an unclad base board of plastic, ceramic, resin laminates, or other dielectric material. The sides of the material may be roughened if necessary and holes are formed therein by any suitable method, such as punching or drilling. After suitable cleaning the circuit board is completely conductivated by a thin film of a conductivator type metal in particle form e.g. colloidal or semi-colloidal palladium, from a suitable liquid suspension as disclosed below. Then a flash coating of a conductor, such as copper, is electrodeposited directly over the thin film of conductivator particles. This plating is started at a plating clip in the plating solution. Next, a resist pattern may be placed on the panel and additional conductive metal such as copper and then tin is electrodeposited to build up the circuit in the desired pattern, through the holes punched in the board as well as along the surfaces. Subsequently, the entire resist pattern and flash coating thereunder may be removed by techniques well known in the art. Alternatively, the resist may be placed directly on the conductivated base to define the desired conductive pattern by masking and then the electroplating of the circuit conductors is accomplished in a single step directly over the unmasked portion of the conductivated base. The resist may be then removed leaving the finished conductive configuration on the surface of the board.

Referring to FIGURE 1, it can be seen that the essential features of applicants' process relates simply to the building of a metal film on a dielectric base by first conductivating the base with a thin film of conductivator type metal (e.g. palladium etc.) in particle form from a liquid suspension and subsequently electroplating directly on the conductivated base with a suitable conductor. The remaining steps of cleaning, masking with a resist etc. are known in the art of making printed circuit boards by either chemical or electroplating methods.

Figure 2:
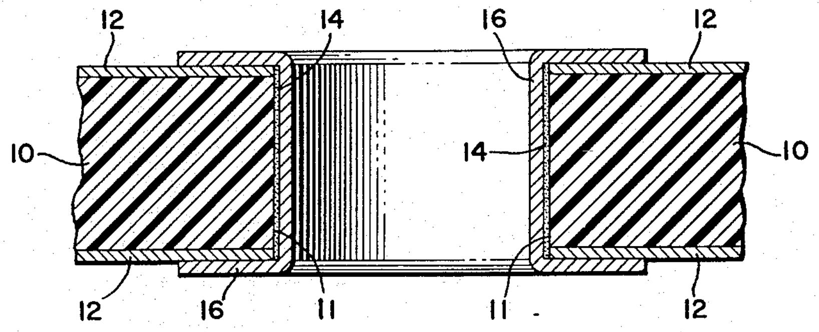
FIGURE 2 illustrates in cross section an electroplated conductive through hole as prepared by the process of this invention.

The method disclosed herein is also particularly useful in electroplating through holes in printed circuit boards. Referring to FIGURE 2, a nonconductive base of a printed circuit board 10 has a conductive foil 12 applied to both faces thereof as is well known in the art of manufacturing printed circuit base materials. A hole 11 of a pre-determined diameter is then formed in the board by punching, drilling, or the like. After the hole 11 has been formed the walls of the hole are devoid of any metal. The board is cleaned to prepare it for the deposition of a thin film of a conductivator type metal in particle form such as colloidal or semi-colloidal palladium.

To deposit a palladium film on the through hole surface the board 10 is immersed in a liquid suspension of palladium in colloidal or semi-colloidal form and agitated. Small palladium particles adhere to the surface to form the thin film. The board may be vibrated while in the suspension of palladium to agitate the suspension and to ensure complete coverage of palladium over the surface within the through holes.

The suspension contains palladium metal in varying degrees of colloidal form. It may be prepared by reducing palladous chloride ($PdCl_2$) with stannous chloride ($SnCl_2$) in an acid solution. Hydrochloric acid is present to prevent the reduced palladium from coagulating. More specifically, palladous chloride is dissolved in a 1:1 solution of hydrochloric acid and distilled water; then, while agitating vigorously, stannous chloride in an amount approximately 10 times as much by weight as the pallous chloride is added to reduce the palladium. In chemical terms the reaction may be denoted as:

$$PdCl_2+SnCl_2 \rightarrow SnCl_4+Pd$$

After the film 14 of conductivator palladium particles is deposited on the walls of the through holes the conductive connection between foil layers 12 may be accomplished by electroplating copper or any other suitable conductor 16 directly over the film 14.

The disclosed process of electroplating a conductor in the through holes of a printed circuit board directly over a thin film of a catalytic and conductive metal in colloidal or semi-colloidal form such as palladium is not obvious even though solid palladium is a conductor of electricity with a conductivity approximately ⅙ that of copper. This is because, even though solid palladium is conductive, the semi-colloidal palladium deposited is a thin barely visible film of particles, so that the resistance between the conductive foil layers on opposite surfaces of the board through the semi-colloidal palladium film is substantial (e.g. in test runs conductivated printed circuit board through holes showed a resistance of approximately $8 \times 10^7$ ohms per through hole), much greater than the resistance of a graphite coated through hole or a lacquer and copper particle coated through hole known in the prior art. Thus it would seem that subsequent electroplating over the film of palladium particles would be difficult if not impossible, but as disclosed herein, this is not the case in actual tests.

The theory as to why a film of conductivator metal in particle form deposited on a dielectric base material serves as an excellent base for subsequent electroplating is not completely known. However, it is postulated that the palladium being by nature both a catalytic metal and a conductive metal has potentialities for simultaneous and combined activating and conductive functions. The plating of the copper in the through holes will take place in the electrolytic bath only when the electric current is on. Again, the conductivity of the palladium film is not enough to start the electroplating under usual conditions as this must be started at a conventional conductor such as a plating clip or foil layer. After the electroplating is started at a conductor it is activated apparently by the catalytic properties of the palladium and the electrodeposition proceeds directly on the film of conductivator particles.

This hypothesis as to the theory of operation is based partially on tests wherein through holes of printed circuit boards were rendered completely conductive by the graphite prior art method and through holes were coated with a conductivator, e.g., a thin film of colloidal or semi-colloidal palladium as in the disclosed method. With the same electroplating conditions the conductivator coated through holes, which had a much higher electrical resistance than the graphite coated holes, acquired the same thickness of metal by an electrodeposit directly on the conductivator film in the same time or less. Since the colloidal palladium deposit in the through holes was an extremely poor conductor to serve as a base for the electroplating as compared with the deposited graphite something must have aided in the electrodeposition i.e., a catalyst must have aided in the plating reaction. When electrodepositing on a larger area dielectric base, e.g., making an additive printed circuit board, the plating action is started at the plating clip in the plating bath and is then accelerated by the catalyst.

Although palladium is the only conductivator type metal mentioned above, other metals having the same properties of combined conductivity and catalytic reactions which could be deposited in colloidal or semi-colloidal form in and from a liquid suspension without the aid of binding medium could be used in place of the palladium particles disclosed herein. For example, other conductive metals such as copper, gold, silver, platinum, nickel, cobalt and iron as mentioned above which are capable of acting as a catalyst and obtainable in liquid suspension in colloidal form could be used for the combined conductor catalyst to provide the base for subsequent electroplating. Also, conductors other than copper could be used as the conductor for connecting the circuits by plating in the through hole, as is well known in the art.

As illustrating but non-limiting examples which are the result of an actual test are set out below:

*Example I.—Through Hole Electroplating*

Printed circuit board base material cut to desired size and having foil attached to a dielectric base material such as epoxy paper laminate were punched to produce through holes at desired locations and subsequently degreased using standard methods, then cleaned by dipping in ammonium persulphate and rinsed. While still wet, the boards were then immersed for 5–10 minutes in a suspension containing the colloidal or semi-colloidal palladium metal and vibrated for the deposition of palladium particles of colloidal or semi-colloidal size on the walls of the through holes.

The suspension was prepared as follows:

To make one liter, dissolve 0.40 g. palladous chloride ($PdCl_2.H_2O$) into a solution of 500 ml. hydrochloric acid (A. R. grade, 37% HCl) and 500 ml. of distilled water. With vigorous agitation add 4.50 g. stannous chloride ($SnCl_2.2H_2O$) to reduce the palladium. A deeply dark and opaque colloidal suspension should be obtained. The usable bath life of this suspension is from 3 to 5 hours to 8 to 9 days i.e. the suspension should be left standing 3 to 5 hours before using and should be discarded after 8 or 9 days of use for optimum results.

Copper was then electroplated directly over the colloidal palladium deposit in a copper pyro-phosphate bath at 120–125° F. for 45 minutes at 25 amperes per square foot resulting in a copper deposit approximately 1 mil in thickness. Higher current densities in plating can, of course, give thicker deposits as desired.

*Example II.—Additive Circuit Board Made by Electroplating (Surface Only)*

An entire printed circuit board starting with an unclad dielectric base and building up a simple circuit on the surface of the base was made as follows: First the board surface was roughened by a vapor blast and then cleaned to remove the grit produced by the vapor blast. The board was dried and then immersed in a liquid suspension containing semi-colloidal palladium particles and the board was vibrated for approximately 10 minutes. The liquid suspension of palladium particles was prepared the same as shown in Example I. After conductivating with palladium particles the board was rinsed with water and dried. The desired pattern was then masked on the surface of the dielectric base directly over the conductivator coating by the use of a resist placed on the base by a standard silk screen process. Then copper was plated directly over the unmasked conductivated layer in a bath of copper pyro-phosphate. A cathode clip attached across the end of the board contacting the unmasked conductivated film acting as common to the circuit conductors was immersed in the plating solution to start the plating action. After the plating had proceeded for about ten minutes and the plating had commenced on the surface of the board the clip was raised from the plating solution just about the level of the solution and the base only remained in the solution. The plating was continued for approximately one hour to plate the desired thickness of the copper conductor and, after plating, the resist was removed by standard techniques leaving only the desired circuit pattern on the surface of the additive board.

*Example III.—Additive Printed Circuit Board and Circuit Board Including Through Holes*

A satisfactory complete additive circuit board containing through holes and other isolated conductive areas was made starting with an unclad dielectric base and placing suitable holes therein at the desired places. Then the surface of the board was roughened and the grit from the roughening operation was removed by rinsing in water and then the board dried. Subsequently the board was conductivated as described in Example II and was flushed again with water and dried. An electrodeposited flash coating of copper was placed over the entire surface of the conductivated board by starting the plating at the plating clip again connected to an edge of the board and used as common. This left a board with a flash coating of copper over the entire surface and on the walls of the through holes therein. The next step was the placing of a resist masking over the board to define the pattern of the desired circuit. Then the unmasked flash coating of copper was built up by electrodepositing additional copper and further covered by a coating of tin/lead by standard electroplating operations. The board was then degreased to remove the resist, leaving the built up circuit with a conductive circuit pattern defined by a tin/lead outer layer, and the remainder of the board with the flash coating of copper thereon. The board was then etched with chromic-sulphuric acid which did not affect the tin/lead outer layer of the desired circuit but did etch the copper flash layer leaving the circuit configuration on the formerly unclad base material. The desired circuit components were placed in the board and the component leads soldered by standard dip soldering operation.

Other ways of constructing additive printed circuits using the techniques disclosed herein may be used as the examples above are not limiting. For example, after conductivation the desired circuit may be defined by a conductive ink resist pattern which is covered by a nonconductive resist so that after the plating has reached the resist pattern there is a current path from the edge of this plating through the conductive ink resist to the conductivated layer for the electroplating of isolated patterns in the printed circuit.

As can be seen from the foregoing the applicant has disclosed a method of electroplating over a nonconductive base, which method is extremely suitable for plating through holes in printed circuit boards as well as making entire additive printed circuit boards. By using this method a great saving in time, materials and labor over the known prior art methods can be obtained and the quality of the finished product can be more effectively controlled.

While there have been shown and described and pointed out the fundamental novelty features of the invention as applied to the preferred embodiment, it will be understood that various omissions and substitutions and changes in the form and details of the device illustrated and in its operation may be made by those skilled in the art without departing from the spirit of the invention. It is the intention, that, therefore, to be limited only as indicated by the scope of the following claims

What is claimed is:

1. A method of obtaining a conductive coating on through holes in printed circuit boards that consists essentially of depositing in the through holes in a circuit board a thin electrically non-conductive film of palladium metal in at least semi-colloidal form and electroplating directly over said thin electrically non-conductive film of palladium.

2. A process of producing a conductive foil coating on a dielectric base comprising: immersing the dielectric in a colloidal liquid suspension of a palladium metal, vibrating the board while in the suspension to deposit a thin electrically non-conductive film of palladium in at least semi-colloidal form onto the dielectric base, the deposit adhering mechanically to the base, and electroplating a conductive metal over the thin electrically non-conductive film of palladium by starting the electroplating at a point on said base in contact with the electrolytic bath from which the conductive metal is plated.

3. A process of making an additive printed circuit board having circuit formations on both sides thereof and connections therebetween through holes, the process comprising: immersing a dielectric base board having holes therein at desired locations in a liquid suspension of at least semi-colloidal palladium to deposit a thin electrically non-conductive coating of the at least semi-colloidal palladium on the entire surface of the board including the holes, electroplating a flash coating of a conductive metal directly over the thin electrically non-conductive coating of the colloidal metal on the entire surface including the holes, the electroplating being started at a point on said base which is in contact with the electrolytic bath from which said flash coating of conductive metal is plated, outlining the desired circuit pattern on the opposite faces of the board with a resist, building up the circuit pattern by additional electroplating on the areas not covered by the resist and removing the resist together with the flash coating and said thin electrically non-conductive coating thereunder to thereby define a printed circuit conductive pattern on both faces of the dielectric board conductively connected through the desired holes.

4. A process as defined in claim 3 wherein the liquid suspension of colloidal palladium is prepared by reducing palladous chloride, with stannous chloride in an acid solution.

5. A process of making an additive printed circuit board having conductive configurations on both sides thereof and conductive connections therebetween through holes, the process comprising: immersing a precut dielectric board having holes therein at desired locations in a liquid suspension of at least semi-colloidal palladium to deposit a thin electrically non-conductive film of the at least semi-colloidal palladium on the entire surface of the board including the holes, outlining the desired circuit pattern on the opposite faces of the board with a resist, electroplating a conductive metal directly on top of the thin electrically non-conductive film of at least semi-colloidal palladium in the areas not covered by the resist and through the holes, the electroplating being started at a point on said base which is in contact with the electrolytic bath from which said electrically conductive metal is plated, and removing the resist and said thin electrically non-conductive film of at least semi-colloidal palladium to thereby define a printed circuit conductive pattern on both faces of the dielectric board and through the holes.

6. A process for producing a conductive coating on a dielectric base comprising depositing an electrically non-conducting film of metal in at least semi-colloidal form, said metal being one selected from the group consisting of palladium, copper, gold, silver, platinum, nickel, cobalt and iron and electroplating a conductive metal directly on said non-conducting film.

7. A process for obtaining a conductive coating on an insulating base comprising depositing an electrically non-conducting film of palladium in at least semi-colloidal form on said base and electroplating a conductive copper film directly on said non-conducting film.

8. A process for obtaining a conductive coating on an insulating base comprising depositing an electrically non-conducting film of palladium in at least semi-colloidal form on said base, applying an electrical contact to said non-contacting film, both said contact and non-conducting film being immersed in a conductive copper electroplating bath and applying current through said contact to electrodeposit a conductive film of copper directly upon said non-conducting film.

9. A process for obtaining a conductive coating on an insulating base comprising depositing an electrically non-conducting film of palladium in at least semi-colloidal form on said base, applying an electrical contact to said non-conducting film, both said contact and non-conducting film being immersed in a copper metal electroplating bath and applying current through said contact to electrodeposit a conductive film of copper directly upon said non-conducting film.

References Cited in the file of this patent

UNITED STATES PATENTS

| | | |
|---|---|---|
| 1,851,699 | Frey | Mar. 29, 1932 |
| 2,303,871 | Walker | Dec. 1, 1942 |
| 2,424,583 | Rahm | July 29, 1947 |
| 2,430,581 | Pessel | Nov. 11, 1947 |
| 2,474,502 | Suchy | June 28, 1949 |
| 2,699,424 | Nieter | Jan. 11, 1955 |
| 2,702,253 | Bergstrom | Feb. 15, 1955 |
| 2,762,714 | Smith et al. | Sept. 11, 1956 |
| 2,848,359 | Talmey | Aug. 19, 1958 |
| 3,006,819 | Wilson et al. | Oct. 31, 1961 |

OTHER REFERENCES

Ephraim, F.: Inorganic Chemistry, Interscience Publishers, New York, fifth edition, 1948, pages 107-113.